United States Patent [19]
Ochi et al.

[11] Patent Number: 5,490,159
[45] Date of Patent: Feb. 6, 1996

[54] VISIBLE LIGHT SEMICONDUCTOR LASER

[75] Inventors: Seiji Ochi; Tatsuya Kimura, both of Itami, Japan

[73] Assignee: Mitsubishi Denki Kabushiki Kaisha, Tokyo, Japan

[21] Appl. No.: 318,337

[22] Filed: Oct. 5, 1994

[30] Foreign Application Priority Data

Oct. 5, 1993 [JP] Japan ................................. 5-248923

[51] Int. Cl.$^6$ ........................................................ H01S 3/19
[52] U.S. Cl. ................................................. 372/43; 372/46
[58] Field of Search ................................... 372/43, 46, 45

[56] References Cited

U.S. PATENT DOCUMENTS

| | | | |
|---|---|---|---|
| 4,432,091 | 2/1984 | Kuroda et al. | 372/45 |
| 4,433,417 | 2/1984 | Burnham et al. | 372/45 |
| 5,153,890 | 10/1992 | Bona et al. | 372/46 |
| 5,331,657 | 7/1994 | Yoo et al. | 372/46 |

FOREIGN PATENT DOCUMENTS

| | | | |
|---|---|---|---|
| 0057696 | 4/1985 | Japan | 372/43 |
| 3185782 | 12/1989 | Japan . | |
| 4306821 | 4/1991 | Japan . | |

OTHER PUBLICATIONS

Applied Physics Letters, vol. 59, No. 9 Mar. (1989), pp. 1360–1367 Itaya et al, "High Power InGaAlP Visible Light Laser Diode by Hetero Barrier Blocking Structure," Japanese Applied Physics, 27 (Spring Meeting, 1990), p. 930 (No Month Available).
Itaya et al, "New Window–Structure InGaAlP Visible Light Laser Diodes By Self–Selective Zn Diffusion–Induced Disordering", IEEE Journal of Quantum Electronics, vol. 27, No. 6, Jun. 1991 pp. 1496–1500.
Colas et al, "Generation Of Macroscopic Steps On Patterned (100) Vicinal GaAs Surfaces", Applied Physics Letters, vol. 55, No. 9, Aug. 1989, pp. 867–869.
Hamada et al, "GaInP Visible Laser Diodes Grown On Misoriented Substrates", IEEE Journal of Quantum Electronics, vol. 27, No. 6, Jun. 1991, pp. 1483–1490.

*Primary Examiner*—Rodney B. Bovernick
*Assistant Examiner*—Yisun Song
*Attorney, Agent, or Firm*—Leydig, Voit & Mayer

[57] ABSTRACT

A visible light semiconductor laser includes a GaAs substrate having a surface making a first angle with a (100) surface toward the [011] direction. A semiconductor layer having a surface making a second angle smaller than the first angle with the (100) surface is disposed on a part of the first surface of the GaAs substrate. The semiconductor layer extends in the [01$\bar{1}$] direction and does not reach the opposite resonator facets of the laser. A first AlGaInP active layer is disposed on the the surface making the second angle with the (100) surface of the semiconductor layer, and the first active layer includes regularly ordered atoms. A second AlGaInP active layer is disposed on the first surface of the GaAs substrate. The second active layer includes disordered atoms and has a band gap energy larger than that of the first active layer. The second active layer serves as a window layer. In this structure, the ordered region and the disordered region of the active layer are produced according to the surface orientation of the underlying crystal layer. As a result, a laser structure in which the disordered region of the active layer is used as a window layer can be fabricated with high uniformity and high reproducibility.

5 Claims, 16 Drawing Sheets

VISIBLE LIGHT SEMICONDUCTOR LASER

FIELD OF THE INVENTION

The present invention relates to a semiconductor laser device producing visible light (hereinafter referred to as a visible light semiconductor laser device) having a window structure. The invention also relates to a method of fabricating the window structure with high uniformity and high reproducibility.

BACKGROUND OF THE INVENTION

A catastrophic optical damage (COD) of a semiconductor laser device during high power operation results from the band gap energy of the active layer being smaller at facets than at a middle part of the active layer due to the presence of surface states in the vicinity of the facets. More specifically, the temperature of the laser locally increases at the facets due to absorption of laser light at the facets during the high power operation. This excess increase in the temperature reduces the band GaP energy at the facets, so that the absorption of the laser light is encouraged and the temperature at the facets further increases. At last, the laser facet is melted, resulting in an irreversible destruction. The light output power at which the facet destruction, i.e., COD, occurs is called the COD threshold optical power. This COD threshold optical power limits the maximum output power of a semiconductor laser comprising AlGaAs or AlGaInP system materials.

In order to prevent COD, the band gap energy of portions of the active layer where surface states will be produced should be increased compared to the band gap energy of the other portions of the active layer. For example, an extended abstract No. 29a-SA-4 of the Japan Society of Applied Physics (Spring Meeting, 1990) discloses an AlGaInP system semiconductor laser including a window structure in which the band gap energy of an active layer is higher in regions in the vicinity of facets than in a central region, whereby the COD threshold optical power is significantly increased to increase the output power of the laser.

When GaInP or AlGaInP is grown under prescribed growth conditions, a natural superlattice structure in which atoms are periodically arranged is formed. When an impurity, such as Zn, is selectively doped into a region of the natural (spontaneous) superlattice structure to disorder the superlattice, the disordered region has a band gap energy larger than that of the other regions. In the above-described publication, an active layer comprising GaInP or AlGaInP is grown under the growth conditions that produce the natural superlattice structure and, thereafter, an impurity is doped into a region of the active layer in the vicinity of the laser facet to form the window structure.

FIG. 10 is a sectional view of an AlGaInP system semiconductor laser having a window structure fabricated by the disordering of the natural superlattice structure, taken along the resonator length direction of the laser. In the figure, reference numeral 101 designates an n type GaAs substrate. An n type $(Al_{0.7}Ga_{0.3})_{0.5}In_{0.5}P$ lower cladding layer 102 having a thickness of about 1.5 μm and a carrier concentration of $5\times10^{17}$ $cm^{-3}$ is disposed on the substrate 101. An undoped $Ga_{0.5}In_{0.5}P$ quantum well (QW) active layer 103 having a natural superlattice structure is disposed on the lower cladding layer 102. The active layer 103 is about 70 nm thick. A p type $(Al_{0.7}Ga_{0.3})_{0.5}In_{0.5}P$ upper cladding layer 104 having a thickness of about 1.5 μm and a carrier concentration of $1\times10^{17}$ $cm^{-3}$ is disposed on the active layer 103. A p type $Ga_{0.5}In_{0.5}P$ band discontinuity reduction (hereinafter referred to as BDR) layer 115 having a thickness of about 0.1 μm and a carrier concentration of $1\times10^{18}$ $cm^{-3}$ is disposed on the upper cladding layer 104. A p type GaAs contact layer 105 having a thickness of about 3 μm and a carrier concentration of $1\times10^{19}$ $cm^{-3}$ is disposed on the BDR layer 115. An n side electrode 106 is disposed on the rear surface of the substrate 101, and a p side electrode 107 is disposed on the contact layer 105. Zn diffused regions 108 are disposed in the vicinity of the laser facets. The active layer 103 includes portions 109 where the natural superlattice structure is disordered. Reference numeral 120 designates emitted laser light.

FIGS. 12(a)–12(d) are sectional views illustrating process steps in a method of fabricating the window structure AlGaInP laser shown in FIG. 10. In these figures, the same reference numerals as in FIG. 10 designate the same or corresponding parts.

Initially, there are successively grown on the n type GaAs substrate 101 the n type AlGaInP lower cladding layer 102, the GaInP QW active layer 103, the p type AlGaInP upper cladding layer 104, the p type GaInP BDR layer 115, and the p type GaAs contact layer 105, producing the laminated structure shown in FIG. 12(a). Preferably, these layers are grown by MOCVD (Metal Organic Chemical Vapor Deposition). The growth condition of the active layer 103 is controlled so that the active layer has a natural superlattice structure.

Thereafter, as shown in FIG. 12(b), an $SiO_2$ pattern 110 having an opening 110a in which the laminated structure is cleaved along the line of alternating long and two short dashes. The width w of the opening 110a is about 20 μm considering the precision of the cleaving process.

In the step of FIG. 12(c), using the $SiO_2$ pattern 110 as a mask, Zn atoms are selectively diffused into the laminated structure by a vapor phase or solid phase diffusion technique, forming a Zn diffused region 108. The superlattice structure of the active layer 103 is disordered at a portion 109 due to the Zn diffusion. The diffusion rate of Zn atoms in GaAs is different from that in AlGaInP. That is, in this structure, the diffusion rate of Zn atoms is higher in the AlGaInP QW active layer 103 and the upper and lower AlGaInP cladding layers 104 and 102 than in the GaAs substrate 101 and the GaAs contact layer 105.

After removal of the $SiO_2$ pattern 110, the n side electrode 106 and the p side electrode 107 are formed on the rear surface of the substrate 101 and on the contact layer 105, respectively. Subsequent to the formation of the electrodes 106 and 107, the resonator facet 150 of the semiconductor laser is formed by cleaving (FIG. 12(d)), completing the semiconductor laser shown in FIG. 10.

A description is given of the operation. When a forward bias voltage is applied across the n side electrode 106 and the p side electrode 107, electrons and holes are injected into the active layer and recombine to produce light. The light thus generated travels along the active layer between the opposed resonator facets 150. When the amplification rate exceeds a threshold, i.e., when the current flowing in the forward biased laser exceeds a threshold current, laser oscillation occurs. Since the natural superlattice in the regions 109 of the active layer 103 in the vicinity of the resonator facets 150 is disordered by the Zn diffusion, the band gap energy of the regions 109 is larger than that of other regions. Therefore, in this prior art laser, the COD threshold optical power is significantly increased to increase the output power of the laser.

FIG. 11 is a sectional view illustrating another AlGaInP system semiconductor laser with a window structure according to the prior art, taken along the resonator length direction of the laser. Also in this laser, the window structure is formed by disordering the natural superlattice structure. In the figure, the same reference numerals as in FIG. 10 designate the same or corresponding parts. Reference numeral 118 designates Zn diffused regions produced at the laser facets.

FIGS. 13(a)–13(d) are sectional views illustrating process steps in a method of fabricating the semiconductor laser shown in FIG. 11. In the figures, the same reference numerals as in FIG. 11 designate the same or corresponding parts.

Initially, as illustrated in FIG. 13(a), an n type AlGaInP lower cladding layer 102, a GaInP QW active layer 103, a p type AlGaInP upper cladding layer 104, a p type GaInP BDR layer 115, and a p type GaAs contact layer 105 are successively grown on an n type GaAs substrate 101 preferably by MOCVD. The growth condition of the active layer 103 is controlled so that the crystal structure of the active layer becomes a natural superlattice structure.

Thereafter, as illustrated in FIG. 13(b), resonator facets 150 are formed by cleaving the laminated structure at a position shown by the line of alternating long and two short dashes.

Thereafter, Zn atoms are diffused from the resonator facet 150 of the laser structure by a vapor phase or solid phase diffusion technique, forming a Zn diffused region 118 as shown in FIG. 13(c). The natural superlattice structure of the active layer is disordered by the Zn diffusion at a region 109 in the vicinity of the laser facet 150. The depth of the impurity diffusion is controlled so that the length of the disordered region 109, i.e., the window region, is about 4~5 µm.

To complete the semiconductor laser, an n side electrode 106 and a p side electrode 107 are formed on the rear surface of the substrate 101 and on the contact layer 105, respectively (FIG. 13(d)).

A description is given of the operation. When a forward bias voltage is applied across the n side electrode 106 and the p side electrode 107, electrons and holes are injected into the active layer 103 and recombine to produce light. The light thus generated travels along the active layer between the opposed resonator facets 150. When the amplification rate exceeds a threshold, i.e., when the current flowing in the forward biased laser exceeds a threshold current, laser oscillation occurs. Since the natural superlattice structure of the active layer 103 is disordered due to the Zn diffusion at the regions 109 in the vicinity of the resonator facets 150, the band gap energy of the active layer 103 is larger in the regions 109 than in the other region. Therefore, also in this prior art laser, the COD threshold optical power is significantly increased to increase the output power of the laser.

In the prior art window structure visible light semiconductor lasers shown in FIGS. 10 and 11, the window structure for preventing COD is realized by the impurity diffused region 109 of the active layer 103 in which the GaInP crystal structure is disordered, utilizing the fact that the band gap energy of the GaInP active layer increases when the GaInP crystal structure is disordered. That is, the band gap energy of the undoped GaInP layer grown by MOCVD is 1.86 eV whereas the band gap energy of the Zn-diffused, i.e., disordered, p type GaInP layer is 1.93 eV, that is, 70 meV larger than 1.86 eV.

In the prior art window structure semiconductor lasers fabricated utilizing the disordered superlattice, Zn atoms are diffused into the QW active layer 103 to disorder the quantum well structure in a region in the vicinity of the resonator facet, and the Zn diffused region 108 (118) extends from the contact layer to the substrate. Since the Zn diffused region 108 (118) has a relatively high carrier concentration and a relatively low resistance compared to the other regions, current injected from the electrode easily flows through this region 108 (118). Therefore, a portion of the current injected from the electrode becomes a leakage current 130 flowing through the Zn diffused region 108 as shown in FIGS. 14(a) and 14(b). The leakage current 130 does not contribute to the light output of the laser. In the prior art window structure semiconductor laser, the threshold current of the laser or the current required for a desired output power unfavorably increases due to the leakage current, resulting in an increase in power consumption.

In the prior art semiconductor laser shown in FIG. 10, when the Zn atoms are diffused from the wafer surface to disorder the superlattice structure, if the diffusion front can be stopped in the AlGaInP lower cladding layer 102, the leakage current is reduced. However, the controllability of the diffusion depth is usually low. Especially, it is very difficult to stop the diffusion front in the AlGaInP lower cladding layer 102 because the diffusion rate of Zn atoms in AlGaInP is very high. Therefore, in many cases, the diffusion front does not stop in the AlGaInP lower cladding layer 102 and reaches the substrate 101. Furthermore, since the position of the diffusion front varies in a wafer, laser devices with uniform characteristics are not produced.

FIG. 9 is a graph illustrating the relationship between the PL (photoluminescent light) peak energies of $Ga_{0.5}In_{0.5}P$ and $(Al_{0.5}Ga_{0.5})_{0.5}In_{0.5}P$ layers and angles of GaAs substrates from the (100) surface toward the [011] direction, disclosed in IEEE Journal of Quantum Electronics, Vol. 27, No. 6, June 1991, pp. 1483–1489.

As shown in FIG. 9, when $Ga_{0.5}In_{0.5}P$ layers are grown on a just (100) GaAs surface (off-angle=0°) and on a surface forming a prescribed angle with the (100) surface (hereinafter referred to as an off-angled surface) by MOCVD at a growth temperature of 680° C. and a V/III ratio (the ratio of group V materials to group III materials) of 550, the $Ga_{0.5}In_{0.5}P$ layer grown on the off-angled surface has a band gap energy larger than the band gap energy of the $Ga_{0.5}In_{0.5}P$ layer grown on the just (100) surface. When the off-angle exceeds 7°, the difference in the band gap energies between these layers exceeds 0.074 eV. The same result as described above is obtained with respect to $(Al_{0.5}Ga_{0.5})_{0.5}In_{0.5}P$.

The above-described shifting in the band gap energy is attributed to the crystal structure of the grown layer. For example, when GaInP is grown under the above-described conditions, GaInP grown on the just (100) surface has a crystal structure schematically shown in FIG. 15 in which Ga atoms 320, P atoms 321, and In atoms 322 are regularly ordered. FIG. 15 is a projection view of a [1̄11] superlattice on a (110) surface. The [1̄10] direction relative to the (001) surface is equal to the [011] direction relative to the (100) surface. Hereinafter, this state of the crystal structure is called an ordered state. On the other hand, GaInP grown on the off-angled surface has a crystal structure schematically shown in FIG. 16 in which Ga atoms 320 and In atoms 322 are not periodically arranged, i.e., these atoms are disordered, increasing the band gap energy of the GaInP. The reason why the shifting of the band gap energy increases with an increase in the off-angle of the substrate is that the degree of the disordering increases with the increase in the off-angle. The relationship between an GaInP crystal structure and the shifting of the band gap energy is described in more detail in Applied Physics Letters, Vol. 59, No. 9 (1989), pp. 1360–1367.

FIGS. 17(a) and 17(b) illustrate a prior art window structure semiconductor laser utilizing the above-described phenomenon, disclosed in Japanese Published Patent Application No. Hei. 3-185782. FIG. 17(a) shows a cross section perpendicular to the resonator length direction of the laser, and FIG. 17(b) shows a cross section taken along the resonator length direction, i.e., along a line 17b—17b of FIG. 17(a).

In FIGS. 17(a) and 17(b), reference numeral 201 designates an n type GaAs substrate having a resonator length of 350 μm and a chip width of 300 μm. The substrate 201 has a (100) oriented surface in a central region intermediate the resonator facets (region A in FIG. 17(b)) and a surface inclined by 5° from the (100) surface toward the [011] direction (hereinafter referred to as 5° off (100) surface) in a region in the vicinity of each resonator facet (region B in FIG. 17(b)). The 5° off (100) surface is formed by a conventional dry etching technique, such as RIE (Reactive Ion Etching) or RIBE (Reactive Ion Beam Etching). The length of the region B is about 20 μm.

An n type $Ga_{0.5}In_{0.5}P$ buffer layer 202 having a thickness of 0.3 μm is disposed on the entire surface of the substrate 201. An n type $(Al_{0.5}Ga_{0.5})_{0.5}In_{0.5}P$ cladding layer 203 having a thickness of 1 μm is disposed on the buffer layer 202. An undoped $Ga_{0.5}In_{0.5}P$ active layer 204 having a thickness of 0.08 μm is disposed on the n type cladding layer 203. These layers are grown by MOCVD.

A p type $(Al_{0.5}Ga_{0.5})_{0.5}In_{0.5}P$ cladding layer 205 is disposed on the active layer 204. The p type cladding layer 205 has a stripe-shaped ridge 205a extending in the resonator length direction. The p type cladding layer 205 is 1.0 μm thick at the ridge 205a and 0.2 μm thick at portions other than the ridge 205a. The width of the top surface of the ridge 205a is 5 μm.

A p type $Ga_{0.5}In_{0.5}P$ cap layer 206 having a thickness of 0.1 μm is disposed on the top surface of the ridge 205a. An n type GaAs current blocking layer 207 is disposed on the p type cladding layer 205, contacting the opposite sides of the ridge 205a. A p type GaAs contact layer 208 is disposed on the cap layer 206 and on the current blocking layer 207.

A p side electrode 209 and an n side electrode 210, each comprising a Cr film, an Sn film, and an Au film successively deposited in this order, are disposed on the contact layer 208 and on the rear surface of the substrate 201, respectively.

In this prior art laser device, the substrate 201 has the just (100) oriented surface in the central region A intermediate the resonator facets and the 5° off (100) oriented surface in the regions B in the vicinity of the resonator facets, and the respective AlGaInP layers are successively grown on the substrate 201.

As shown in FIG. 9, with an increase in the off-angle of the substrate, the band gap energies of the $Ga_{0.5}In_{0.5}P$ layer and the $(Al_{0.5}Ga_{0.5})_{0.5}In_{0.5}P$ layer increase. The band gap energy of these layers on the 5° off (100) surface is about 60 meV larger than that on the just (100) surface.

Therefore, in the prior art laser device, the energy band gaps of the respective AlGaInP system semiconductor layers are about 60 meV larger in the B regions than in the A region. Consequently, light absorption in the regions B near the resonator facets is suppressed, whereby the COD is reduced.

FIG. 18 is a graph illustrating light output power vs. current characteristics of this prior art laser device. As shown in FIG. 18, a good linearity without kinks is maintained until the light output power exceeds 30 mW. FIG. 19 is a graph illustrating a result of a life test of the prior art laser device. In the life test, the laser device is driven at a constant output power of 20 mW and a temperature of 40° C. In FIG. 19, the dashed line shows a result of a life test of a laser device that is fabricated by growing a plurality of semiconductor layers as shown in FIG. 17(b) on a flat substrate and forming Zn diffused regions in the vicinity of the resonator facets to increase the band gap energy at the resonator facets.

It is found from FIG. 19 that a significant increase in the life time is achieved in the prior art device. The reason is as follows. In the laser device having the window structure formed by Zn diffusion, a lot of crystal defects caused by excess impurity doping are present in the vicinity of the laser facet, so that unwanted heat is generated in this region due to light absorption, adversely affecting the performance of the laser device. On the other hand, in the prior art laser device shown in FIGS. 17(a)–17(b), since the window structure at the laser facet is produced only by growing the semiconductor layers on the off-angled surface of the substrate by MOCVD, the crystal defects are significantly reduced, increasing life time and reliability.

As described above, in the prior art laser device shown in FIGS. 17(a) and 17(b), the window structure is produced utilizing the fact that the superlattice structure of the active layer 204 is disordered and the band gap energy is increased when it is grown on the off-angled surface. However, since the portions of the active layer 204 in the window structure, i.e., in the regions B, are grown on the off-angled surface in the resonator length direction, if the off-angle is large, light generated in the active layer in the central region A unfavorably leaks from the active layer when the light passes through the boundary between the region A and the region B. In this case, since the upper and lower cladding layers 205 and 203 in the window structure have energy band gaps larger than the energy band gap of the active layer 204, the function of the window structure is achieved by the cladding layers. However, this structure is not a window structure utilizing a disordered region of an active layer having an increased energy band gap as a window.

Further, the fabrication of the laser structure shown in FIGS. 17(a) and 17(b) includes selectively dry-etching the (100) oriented substrate to form the off-angled regions at the opposite ends of the substrate in the resonator length direction. However, it is impossible to perform the dry etching while maintaining a precise angle of the inclination. In addition, since the dry-etched surface is damaged, a crystal layer grown thereon has a degraded and uneven surface and dislocations. Consequently, it is impossible or very difficult to fabricate this structure.

SUMMARY OF THE INVENTION

It is an object of the present invention to provide a relatively simple method of fabricating a window structure of a visible light semiconductor laser with high uniformity and high reproducibility.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, a visible light semiconductor laser includes a GaAs substrate having opposite first and second surfaces, the first surface forming a first angle with a (100) surface toward the [011] direction. For example, the first surface of the GaAs substrate is inclined by 7° from the (100) surface toward the [011] direction. A semiconductor layer having a (100) surface or a surface forming a second angle smaller than the first angle with the (100) Surface is disposed on a part of the first surface of the GaAs substrate. The semiconductor layer extends in the [01$\bar{1}$] direction, i.e., the resonator length direction of the laser, and does not reach the opposite resonator facets of the laser. A first $Al_xGa_{1-x}InP$ (0≦x) active layer is disposed on the (100) surface or the surface forming the second angle with the (100) surface of the semiconductor layer via prescribed semiconductor layers, and the first active layer includes regularly ordered atoms. A second $Al_xGa_{1-x}InP$ active layer that is grown synchronously with the first active layer, is disposed on the first surface of the GaAs substrate at the opposite sides of the first active layer in the resonator length direction via prescribed semiconductor layers. The second active layer includes disordered atoms and has a band gap energy larger than the band gap energy of the first active layer. The second active layer serves as a window layer. In this structure, the ordered region and the disordered region of the active layer are produced according to the surface orientation of the underlying crystal layer on which the active layer is grown. As the result, a laser structure in which the disordered region of the active layer is used as a window layer can be fabricated with high uniformity and high reproducibility.

According to a second aspect of the present invention, in a method of fabricating a visible light semiconductor laser, initially, a first conductivity type GaAs substrate having opposite first and second surfaces wherein the first surface forms a first angle with a (100) surface toward the [011] direction is prepared. Then, an insulating film is formed on the first surface of the GaAs substrate and patterned to form a rectangular opening extending in what becomes the resonator length direction of the laser so as not to reach the resonator facets. Thereafter, a first conductivity type semiconductor layer is grown on a part of the first surface of the GaAs substrate exposed in the opening of the insulating film so that it has a (100) surface or a surface forming a second angle smaller than the first angle with the (100) surface. After removal of the insulating film by etching, a first conductivity type AlGaInP cladding layer, an undoped $Al_xGa_{1-x}InP$ (0≦x) active layer, a second conductivity type AlGaInP layer, and a second conductivity type GaAs cap layer are successively grown on the entire surface of the GaAs substrate so that a portion of the active layer grown on the first conductivity type semiconductor layer is in an ordered state and a portion of the active layer grown on the first conductivity type GaAs substrate is in the disordered state. Finally, a second conductivity side electrode and a first conductivity side electrode are produced on the second conductivity type cap layer and on the second surface of the GaAs substrate, respectively. Since the ordered region and the disordered region of the active layer is produced according to the surface orientation of the underlying crystal layer on which the active layer is grown, production is facilitated and reliability is improved.

According to a third aspect of the present invention, in the above-described production method, in place of the crystal growth of the respective semiconductor layers on the entire surface of the substrate including the first conductivity type semiconductor layer, a selective growth using an insulating mask is performed to grow the respective semiconductor layers in a stripe shape in the [01$\bar{1}$] direction. Therefore, the laser structure in which the disordered region of the active layer is used as a window layer can be fabricated with high uniformity and high reproducibility.

According to a fourth aspect of the present invention, in the above-described visible light semiconductor laser, the GaAs substrate has a rectangular groove in a prescribed region of the first surface where the $Al_xGa_{1-x}InP$ (0≦x) active layer in the ordered state is to be formed. The groove extends in the resonator length direction of the laser but does not reach the resonator facets. The semiconductor layer having the (100) surface or the surface forming the second angle smaller than the first angle with the (100) surface is grown in the groove so that the surface of the semiconductor layer in the groove does not completely protrude from the surface of the GaAs substrate. Therefore, the level difference between the ordered region and the disordered region of the active layer can be reduced, resulting in a window structure semiconductor laser with improved characteristics.

According to a fifth aspect of the present invention, in the above-described method of fabricating a visible light semiconductor laser, a rectangular groove is formed in a prescribed region of the first surface of the substrate using an etching technique with an insulating mask. The groove extends in the resonator length direction of the laser but does not reach the resonator facets. Thereafter, the first conductivity type semiconductor layer is grown in the groove. Therefore, the laser structure in which the disordered region of the active layer is used as a window layer can be fabricated with high uniformity and high reproducibility.

According to a sixth aspect of the present invention, in the above-described method of fabricating a visible light semiconductor laser, a stripe-shaped rectangular groove is formed at the first surface of the GaAs substrate so that the groove extends in what becomes the resonator length direction of the laser without reaching the resonator facets, and the semiconductor layer of the first conductivity type is grown on the entire first surface of the GaAs substrate so that at least a portion of the semiconductor layer grown in the groove has a (100) surface or a surface forming a second angle smaller than the first angle with the (100) surface. Therefore, the step of removing the insulating film after the growth of the semiconductor layer is dispensed with, whereby the production process is simplified.

DETAILED DESCRIPTION OF THE PREFERRED EMBODIMENTS

Embodiment 1

Figure 1:
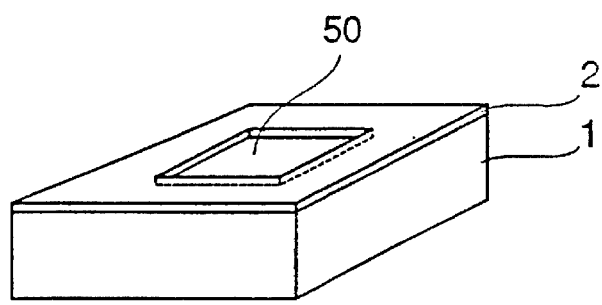
FIGS. 1(a)–1(d) are perspective views and sectional views illustrating process steps of fabricating a window structure visible light semiconductor laser in accordance with a first embodiment of the present invention.
Figure 1:
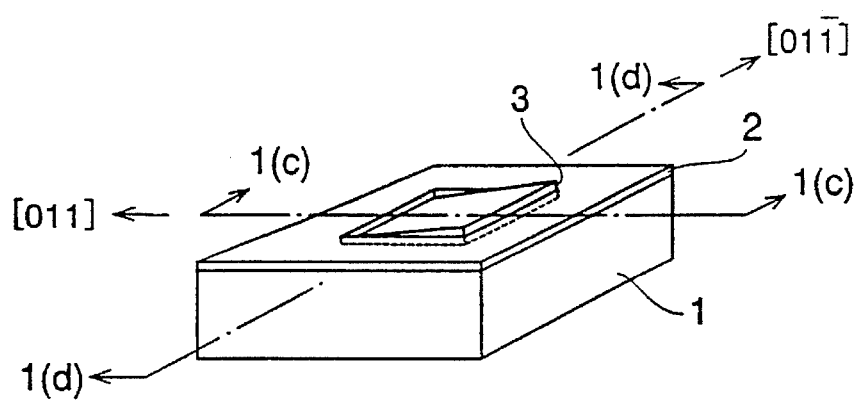
Figure 1:
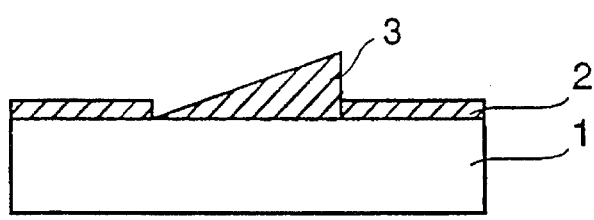
Figure 1:
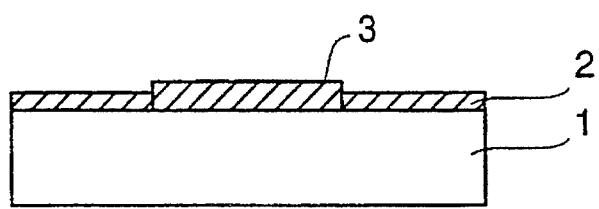

FIGS. 1(a)–1(d), 2(a)–2(c), 3(a)–3(b) are diagrams for explaining a window-structure visible light semiconductor laser and a production method of the laser, according to a first embodiment of the present invention.

In these figures, reference numeral 1 designates an n type GaAs substrate having a surface orientation of 7° off from (100) toward the [011] direction (hereinafter referred to as a 7° off (100) substrate). An n type $(Al_{0.7}Ga_{0.3})_{0.5}In_{0.5}P$ lower cladding layer 4 having a thickness of about 1.5 μm and a carrier concentration of $5\times10^{17}$ cm$^{-3}$ is disposed on the substrate 1. An undoped $Ga_{0.5}In_{0.5}P$ active layer 5 about 70 nm thick is disposed on the lower cladding layer 4. A p type $(Al_{0.7}Ga_{0.3})_{0.5}In_{0.5}P$ upper cladding layer 6 having a thickness of about 1.5 μm and a carrier concentration of $1\times10^{17}$ cm$^{-3}$ is disposed on the active layer 5. A p type $Ga_{0.5}In_{0.5}P$ BDR layer 7 having a thickness of about 0.1 μm and a carrier concentration of $1\times10^{18}$ cm$^{-3}$ is disposed on the upper cladding layer 6. A p type GaAs cap layer 8 having a carrier concentration of $1\times10^{19}$ cm$^{-3}$ is disposed on the BDR layer 7. The cap layer 8, the BDR layer 7, and the upper cladding layer 6 are formed in a stripe-shaped mesa. An n type GaAs current blocking layer 9 having a thickness of about 1 μm and a carrier concentration of $5\times10^{18}$ cm$^{-3}$ is disposed on the upper cladding layer 6, contacting the opposite sides of the stripe-shaped mesa. A p type GaAs contact layer 10 having a thickness of about 3 μm and a carrier concentration of $1\times10^{19}$ cm$^{-3}$ is disposed on the top surface of the mesa and on the current blocking layer 9. A p side electrode 14 and an n side electrode 15 are disposed on the contact layer 10 and the rear surface of the substrate 1, respectively.

A description is given of the production method of the window-structure visible light semiconductor laser.

Initially, as illustrated in FIG. 1(a), an SiN film 2 is deposited on the 7° off (100) oriented n type GaAs substrate 1 and patterned using a conventional photolithographic technique to form a rectangular opening 50. The opening 50 is 5 μm wide and 300 μm long. The longitudinal direction of the opening 50 corresponds to the resonator length direction of the laser, and the resonator length direction is a [01$\bar{1}$] direction.

Thereafter, as illustrated in FIG. 1(b), using the SiN film 2 as a mask, an n type GaAs layer 3 is selectively grown on the substrate 1 exposed in the opening 50. FIGS. 1(c) and 1(d) are sectional views of the structure shown in FIG. 1(b) taken along lines 1c—1c and 1d—1d of FIG. 1(b), respectively. As described in Applied Physics Letters, Vol. 55, No. 9, 28 August 1989, pp. 867–869, the n type GaAs layer 3 grown on the 7° off (100) substrate 1 has a just (100) top surface.

Figure 8:
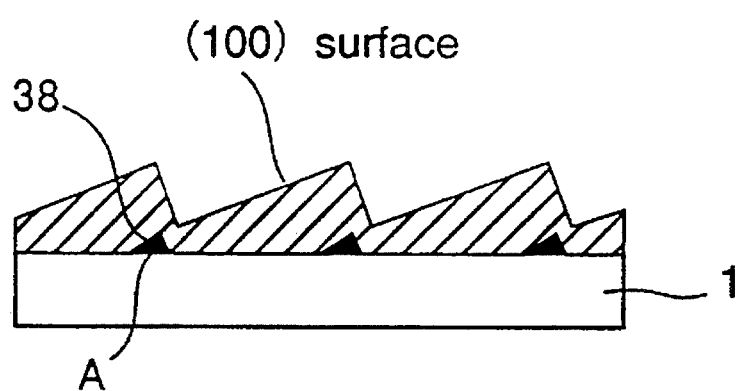
FIGS. 8(a)–8(b) are sectional views for explaining a growth mechanism of an n type GaAs layer 3 in the process steps of FIG. 1(c).
Figure 8:
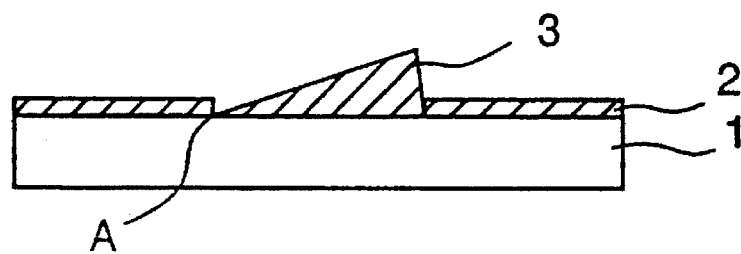

The reason why the just (100) oriented GaAs layer 3 is grown on the 7° off (100) oriented substrate 1 will be described using FIGS. 8(a) and 8(b).

When a crystal layer is grown on a substrate off-angled from the (100) surface toward the [011] direction, if the substrate has a periodic pattern that stops a step flow at the off-angled surface, the crystal layer is grown forming a periodic pattern of steps having a (100) surface. In this first embodiment of the invention, a portion of this periodic pattern corresponding to one step is used for crystal growth. For example, when a periodic pattern 38 that stops a step flow, i.e., that prevents supply of atoms from the left side of the point A, is present on the off-angled substrate 1 as shown in FIG. 8(b), a wedge-shaped layer 3 having a (100) surface is grown. This step flow mechanism is described in more detail in Japanese Published Patent Application No. Hei. 4-306821.

Figure 2:
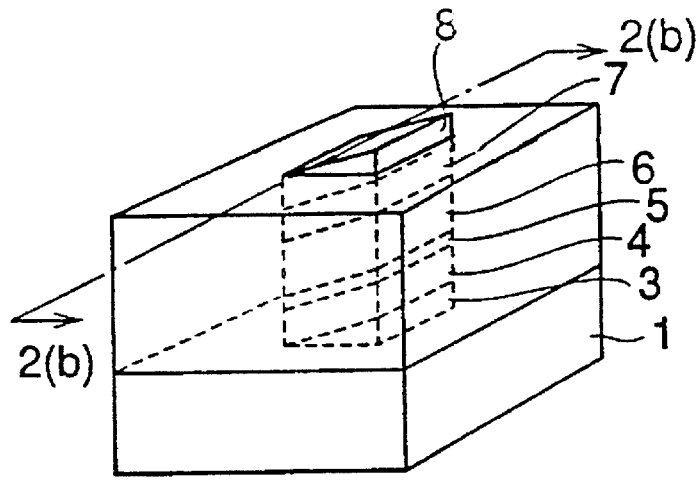
FIGS. 2(a)–2(c) are perspective views and a sectional view illustrating process steps of fabricating the window structure visible light semiconductor laser in accordance with the first embodiment of the present invention.
Figure 2:
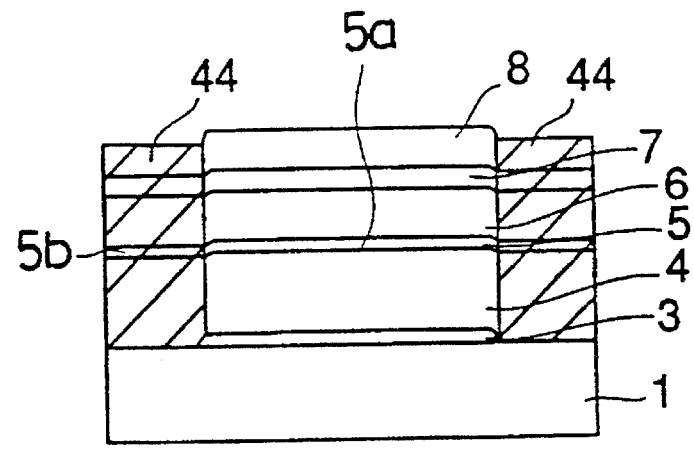
Figure 2:
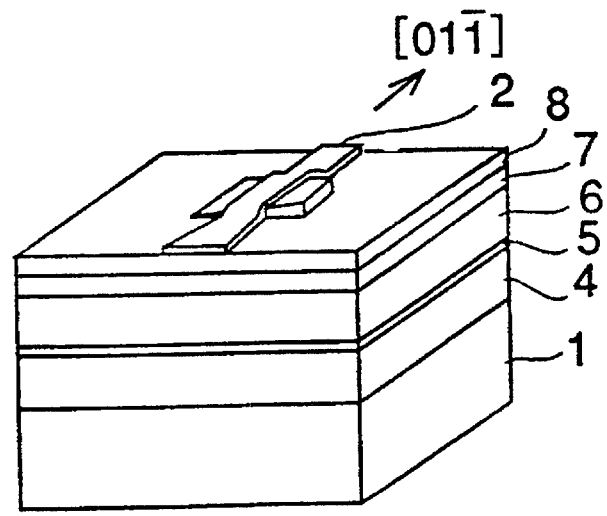

After the growth of the just (100) oriented n type GaAs layer 3, the SiN film 2 is removed with HF. Thereafter, an n type AlGaInP cladding layer 4, an undoped GaInP active layer 5, a p type AlGaInP layer 6, a p type GaInP BDR layer 7, and a p type GaAs cap layer 8 are successively grown by MOCVD (FIG. 2(a)). In FIG. 2(a), the respective layers 4 to 7 grown on the 7° off (100) substrate 1 are not shown. In the crystal growth, the just (100) surface and the 7° off (100) surface of the substrate 1 are transferred to the respective layers grown on the substrate. That is, the undoped GaInP active layer 5 has an ordered region on the just (100)

oriented layer 3 and a disordered region on the 7° off (100) substrate 1.

FIG. 2(b) is a sectional view taken along a line 2b—2b of FIG. 2(a), i.e., along the resonator length direction of the laser structure. In FIG. 2(b), portions of the layers 4 to 7 grown on the 7° off (100) surface of the substrate 1 are shown by hatching. The undoped GaInP active layer 5b in the hatched region 44 is disordered. On the other hand, the undoped GaInP active layer 5a grown on the just (100) surface of the GaAs layer 3 in the center region of the structure is ordered. The band gap energy of the disordered GaInP active layer 5b is larger than the band gap energy of the ordered GaInP active layer 5a. In this structure, the hatched portions 44 serve as window layers of the laser device.

Further, in a cross section of the structure shown in FIG. 2(a) taken along a line perpendicular to the line 2(b)—2(b) (not shown), the laminated structure of the semiconductor layers grown on the about 5 μm wide just (100) surface of the GaAs layer 3 are sandwiched by the laminated structure grown on the 7° off (100) substrate 1. Therefore, utilizing the difference in the energy band gaps, electrons and holes in the active layer 5a grown on the just (100) surface are confined in its width direction.

In the step of FIG. 2(c), an SiN film 2 is deposited on the surface of the laminated structure and patterned by a conventional photolithographic technique, forming a stripe-shaped pattern of the SiN film 2. The stripe-shaped SiN pattern is formed in the [01$\bar{1}$] direction and across the just (100) oriented region.

Figure 3:
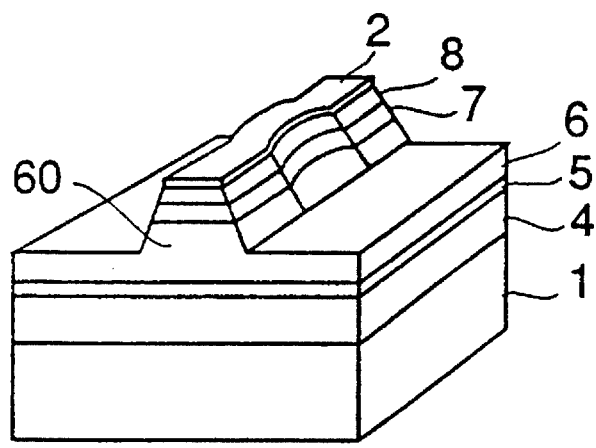
FIGS. 3(a)–3(b) are perspective views illustrating process steps of fabricating the window structure visible light semiconductor laser in accordance with the first embodiment of the present invention.
Figure 3:
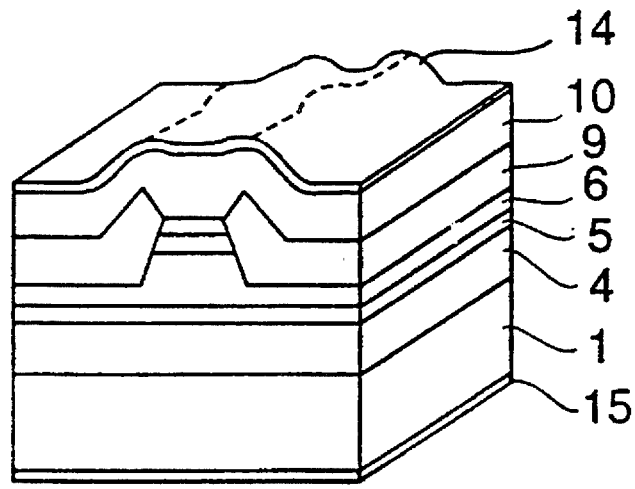

Using the stripe-shaped SiN film 2 as a mask, the p type GaAs cap layer 8, the p type GaInP BDR layer 7, and the p type AlGaInP cladding layer 6 are selectively etched away, forming a stripe-shaped mesa 60 as shown in FIG. 3(a). In the etching process, about 0.25 μm thick portions of the p type AlGaInP cladding layer 6 are left at the opposite sides of the mesa 60. Thereafter, n type GaAs current blocking layers 9 are grown on the cladding layer 6, contacting the opposite sides of the mesa 60. After removal of the SiN film 2 with HF, a p type GaAs contact layer 10 is grown on the mesa 60 and on the cladding layer 6. Finally, a p side electrode 14 and an n side electrode 15 are formed on the p type contact layer 10 and on the rear surface of the GaAs substrate 1, respectively, completing a semiconductor laser as shown in FIG. 3(b).

In operation, when a voltage is applied across the p side electrode 14 and the n side electrode 15, current flowing toward the active layer 5 is concentrated by the n type GaAs current blocking layers 9, whereby the current is injected into a desired portion of the undoped GaInP active layer 5 with high efficiency. In this way, a loss guide type semiconductor laser device is achieved.

In the window structure semiconductor laser according to the first embodiment of the present invention, the GaAs layer 3 with a (100) oriented surface is formed in the center of the 7° off (100) oriented GaAs substrate 1, and the semiconductor layers 4 to 7 are successively grown on the GaAs substrate 1 with the GaAs layer 3. Therefore, the ordered active layer 5a is formed in the center of the structure while the disordered active layers 5b are formed at the opposite sides of the ordered active layer 5a. The disordered active layers 5b having an energy band gap larger than that of the ordered active layer 5a are window structures at the opposite facets of the laser. This laser structure including the disordered active layers 5b is fabricated with high uniformity and reproducibility.

Further, in this first embodiment of the invention, the GaAs layer 3 having a just (100) surface is grown on the 7° off (100) substrate 1 utilizing the principle of step growth, whereby the off-angled surface and the just (100) surface are formed on the substrate. Therefore, an off-angled surface forming a desired angle with the (100) surface is produced with high reliability, differently from the prior art semiconductor laser disclosed in Japanese Published Patent Application No. Hei. 3-185782 in which the off-angled surface is formed by dry etching.

Further, different from the above-described prior art laser, the position of the active layer 5b in the window region is not significantly deviated from the position of the active layer 5a in the resonator region due to the off-angle of the substrate, so that the ordered region and the disordered region of the GaInP active layer are accurately determined by the surface orientation of GaAs before the growth of the GaInP active layer.

Figure 9:
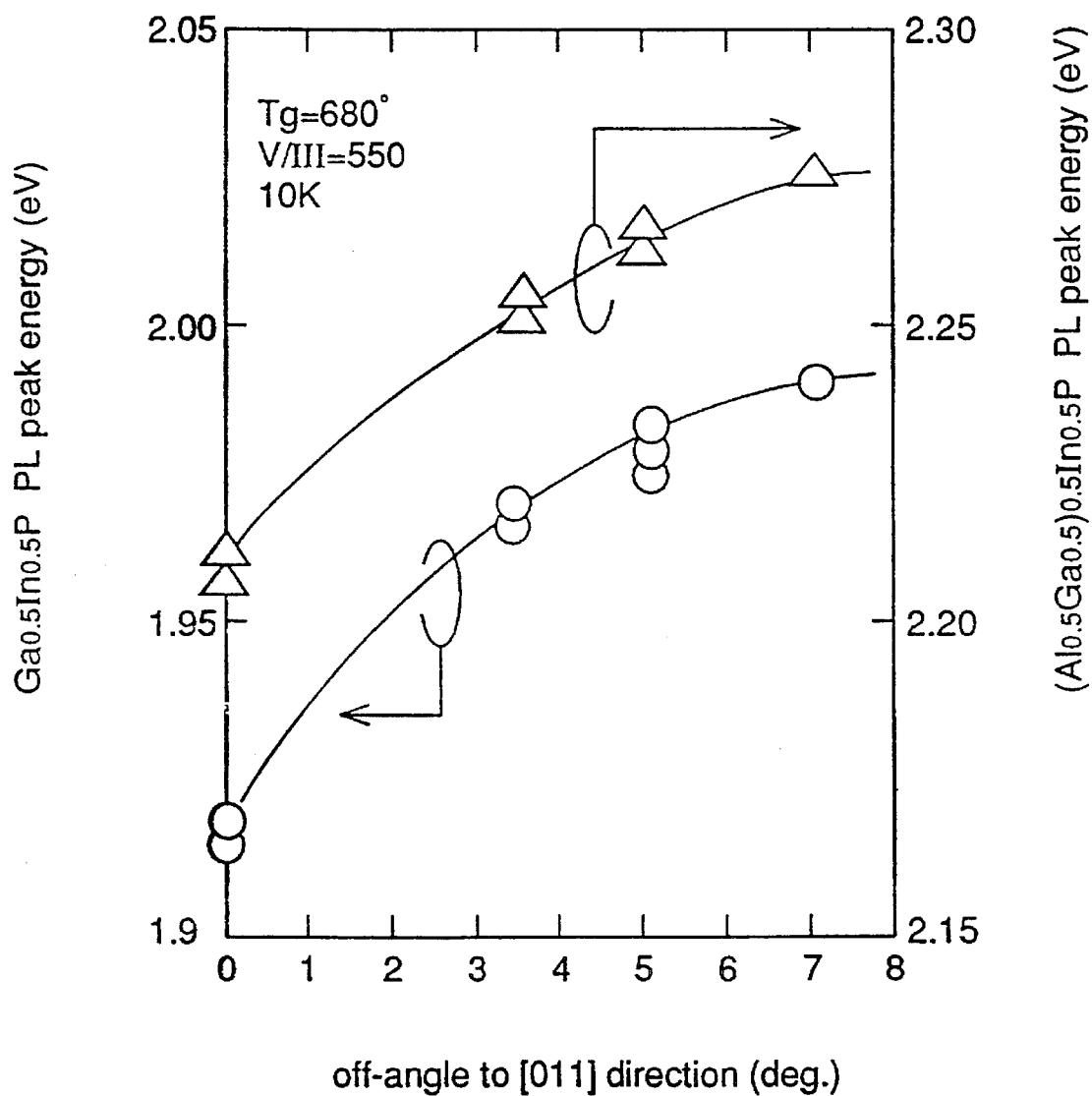
FIG. 9 is a graph illustrating the relationship between the PL peak energies of $Ga_{0.5}In_{0.5}P$ and $((Al_{0.5}Ga_{0.5})_{0.5}In_{0.5}P$ layers and angles of GaAs substrates from the (100) surface toward the [011] direction.
Figure 10:
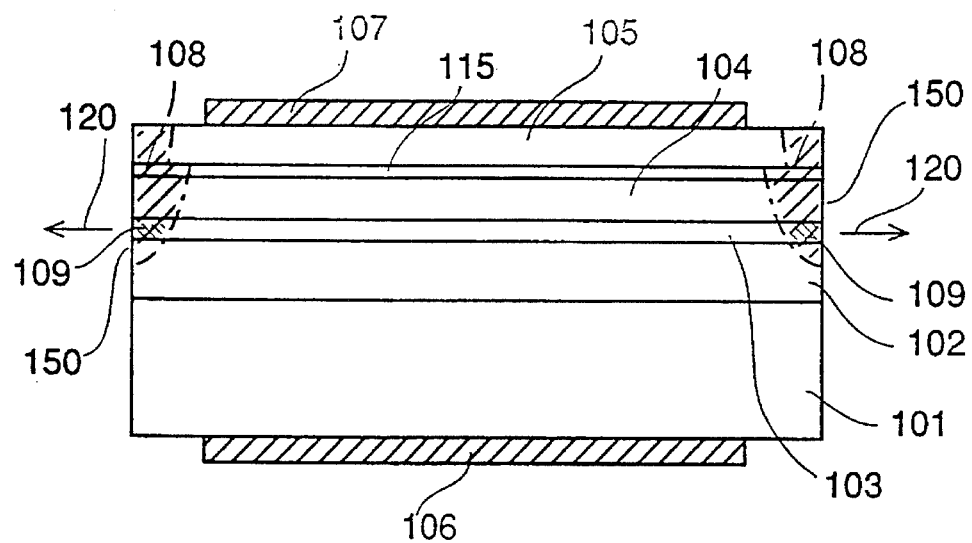
FIG. 10 is a sectional view illustrating a window structure AlGaInP system semiconductor laser fabricated utilizing disordering of a natural superlattice by impurity diffusion, taken along the resonator length direction of the laser, according to the prior art.
Figure 11:
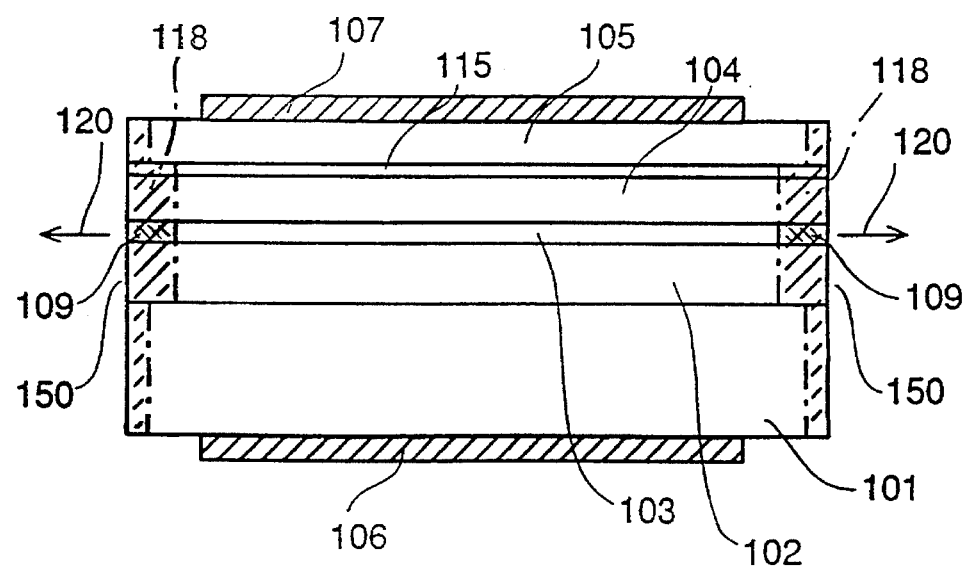
FIG. 11 is a sectional view illustrating a window structure AlGaInP system semiconductor laser fabricated utilizing disordering of a natural superlattice by impurity diffusion, taken along the resonator length direction of the laser, according to the prior art.
Figure 12:
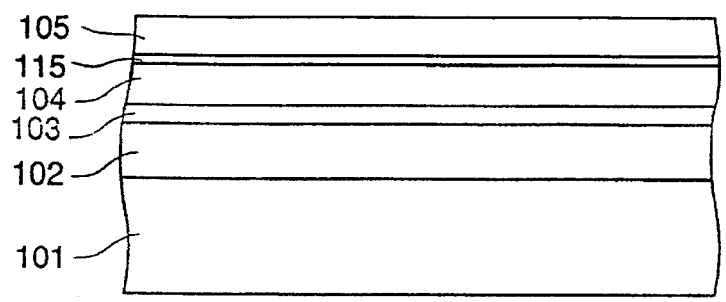
FIGS. 12(a)–12(d) are sectional views illustrating process steps in a method of fabricating the semiconductor laser shown in FIG. 10.
Figure 12:
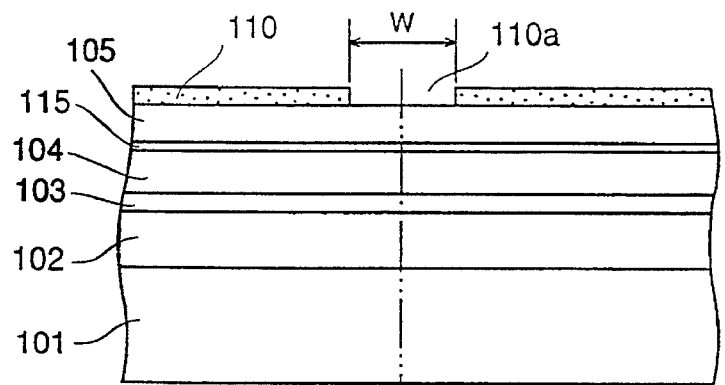
Figure 12:
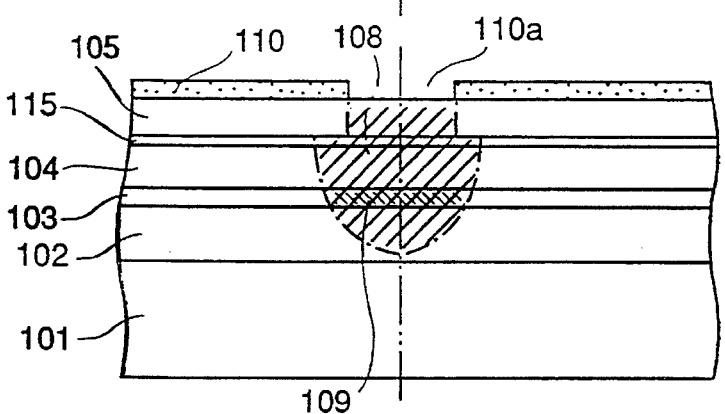
Figure 12:
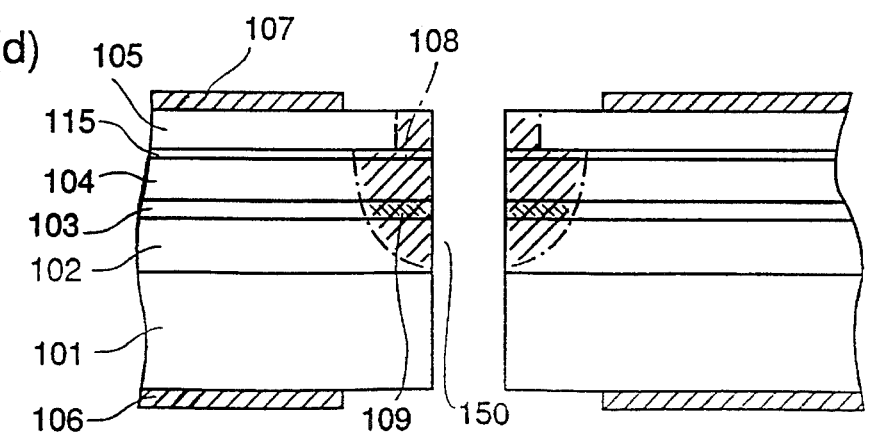
Figure 13:
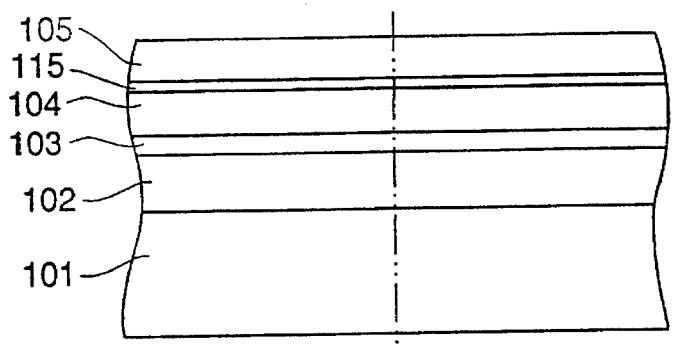
FIGS. 13(a)–13(d) are sectional views illustrating process steps in a method of fabricating the semiconductor laser shown in FIG. 11.
Figure 13:
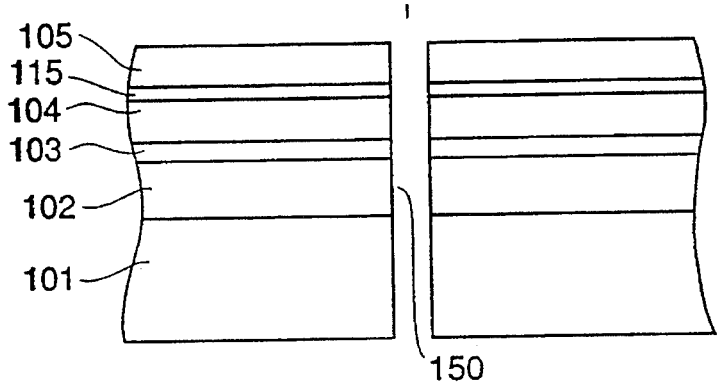
Figure 13:
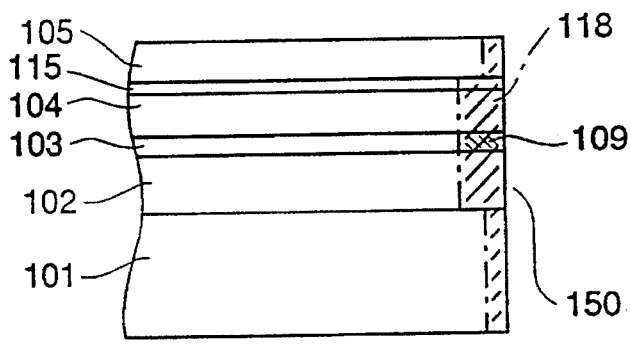
Figure 13:
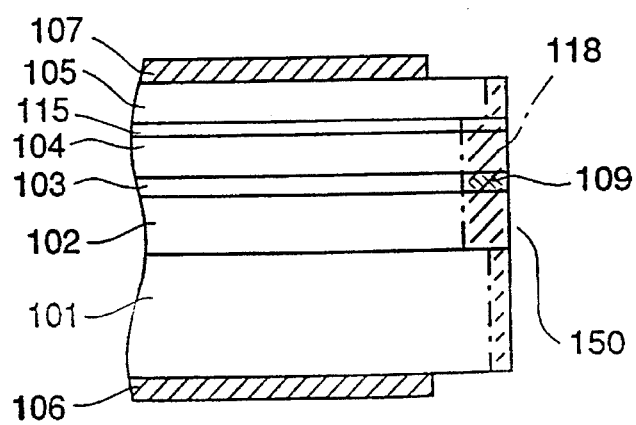
Figure 14:
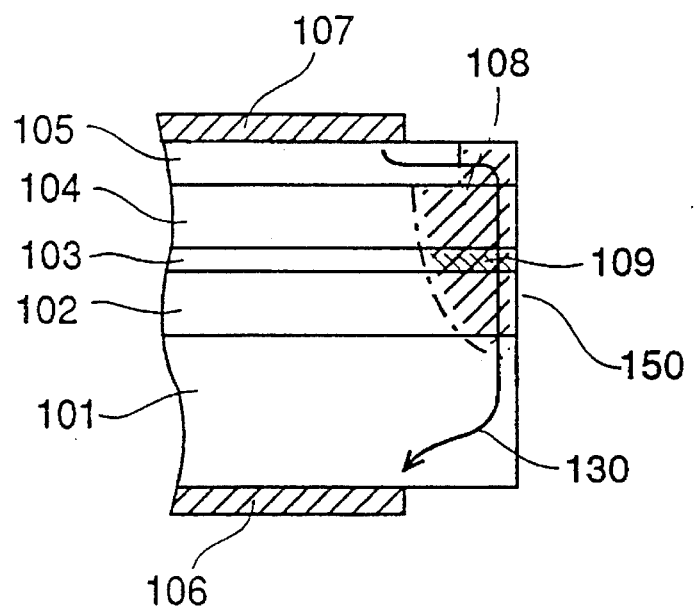
FIGS. 14(a)–14(b) are sectional views for explaining problems in the semiconductor lasers shown in FIGS. 10 and 11.
Figure 14:
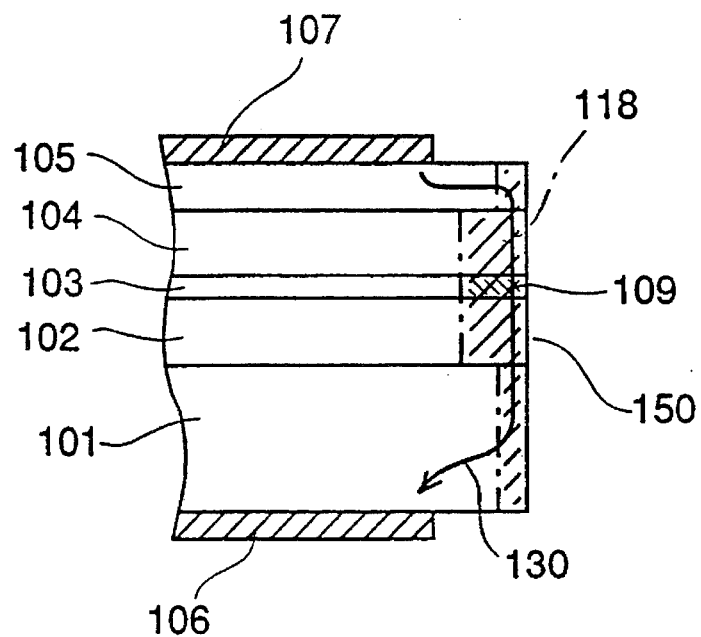
Figure 15:
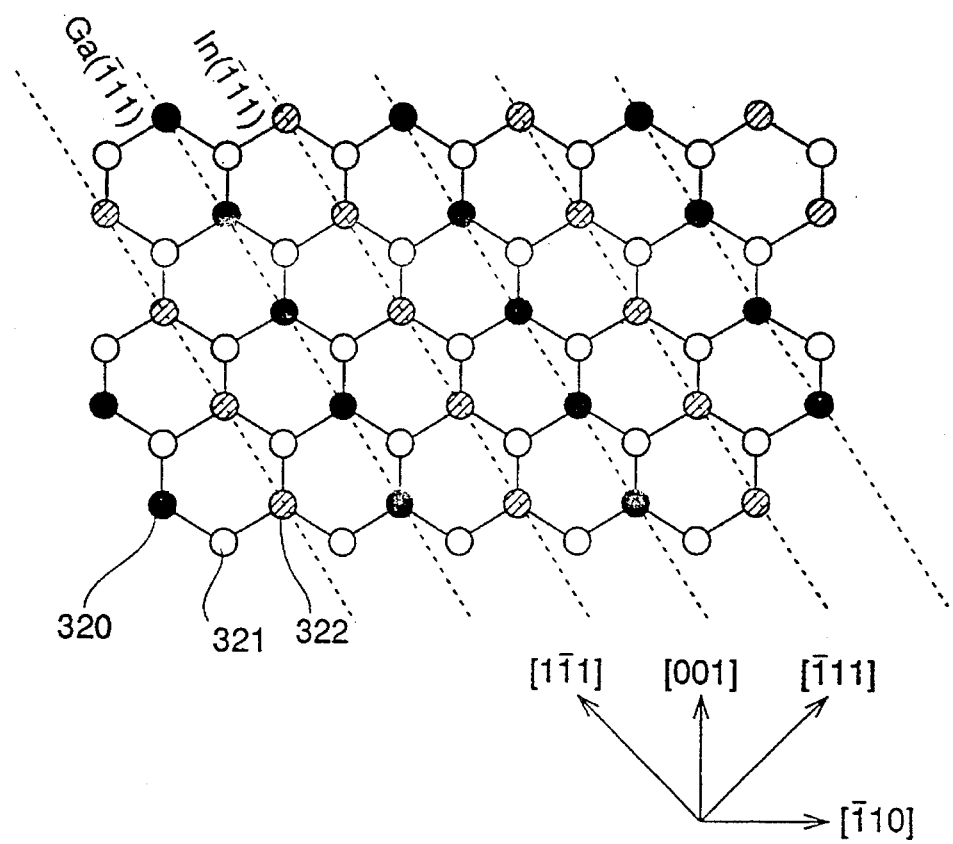
FIG. 15 is a schematic diagram illustrating a crystal structure of a GaInP layer grown on a just (100) surface under prescribed growth conditions.
Figure 16:
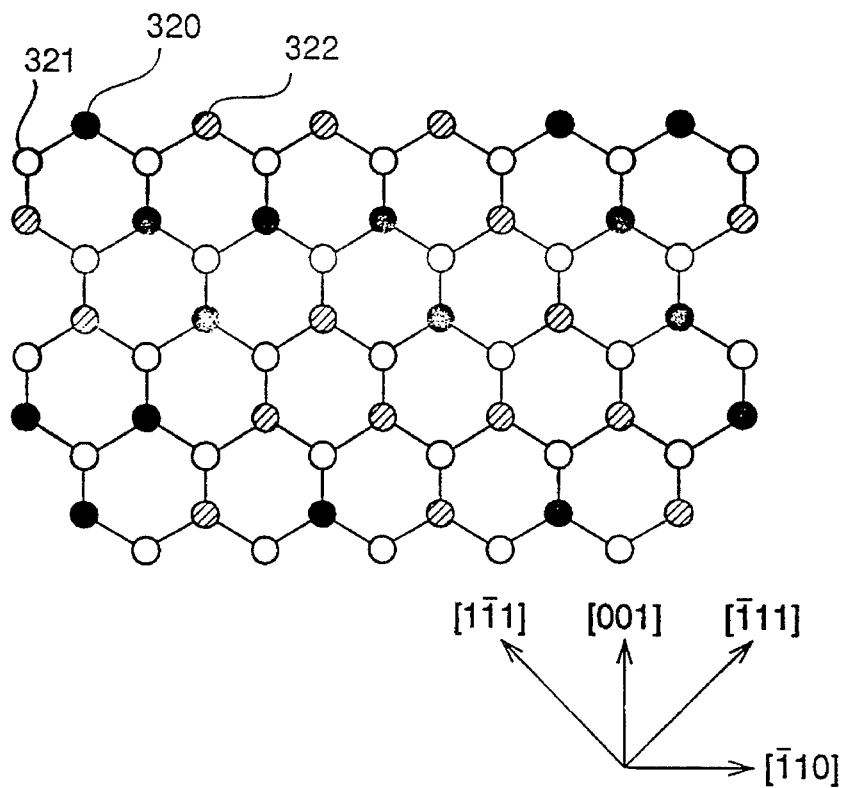
FIG. 16 is a schematic diagram illustrating a crystal structure of a GaInP layer grown on an off-angled surface under prescribed growth conditions.
Figure 17:
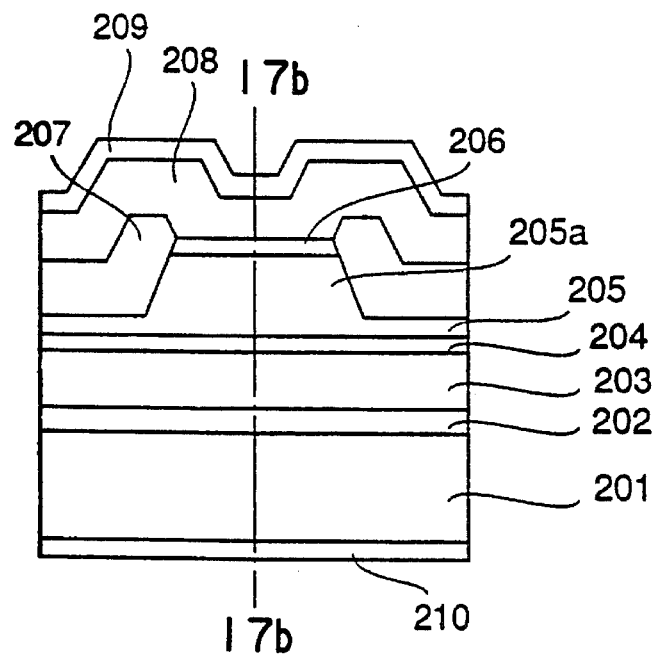
FIGS. 17(a)–17(b) are sectional views illustrating a window structure semiconductor laser fabricated utilizing the phenomenon shown in FIG. 9, according to the prior art.
Figure 17:
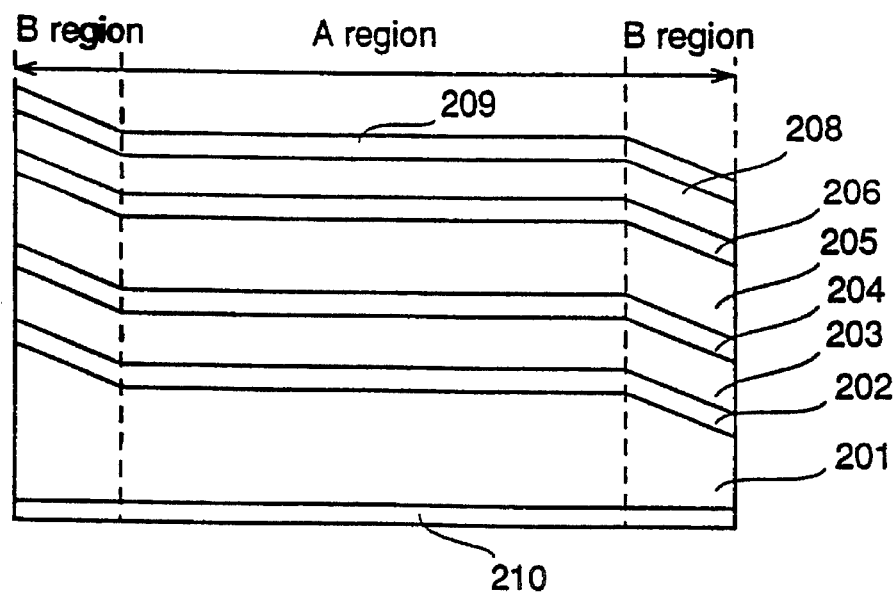
Figure 18:
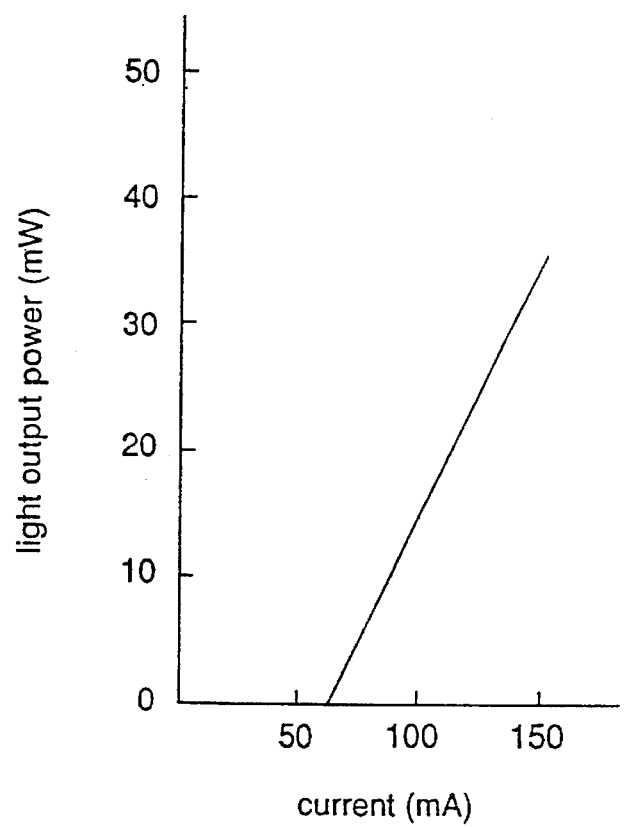
FIG. 18 is a graph illustrating current vs. light output characteristics of the prior art laser shown in FIGS. 17(a)–17(b).
Figure 19:
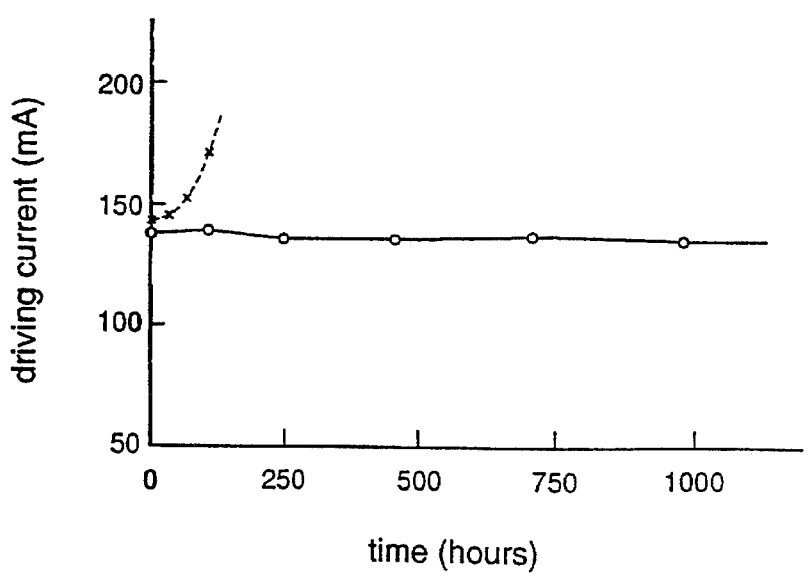
FIG. 19 is a graph illustrating a result of a life test of the prior art laser shown in FIGS. 17(a)–17(b).

Although in the above-described first embodiment the off-angle of the GaAs substrate 1 is 7°, the same effects as described above are obtained when the off-angle is larger than 4° because an energy difference exceeding 0.05 eV is attained with the off-angle of 4° as shown in FIG. 9. On the other hand, when the off-angle exceeds 7°, the energy difference does not significantly change. However, an off-angle exceeding 10° adversely affects the crystal quality. Therefore, the off-angle should be in a range from 4° to 10°.

Embodiment 2

While in the above-described first embodiment a current confinement structure is produced by the n type GaAs current blocking layers 9, in this second embodiment of the invention a current confinement structure is produced by selective growth of semiconductor layers.

Figure 4:
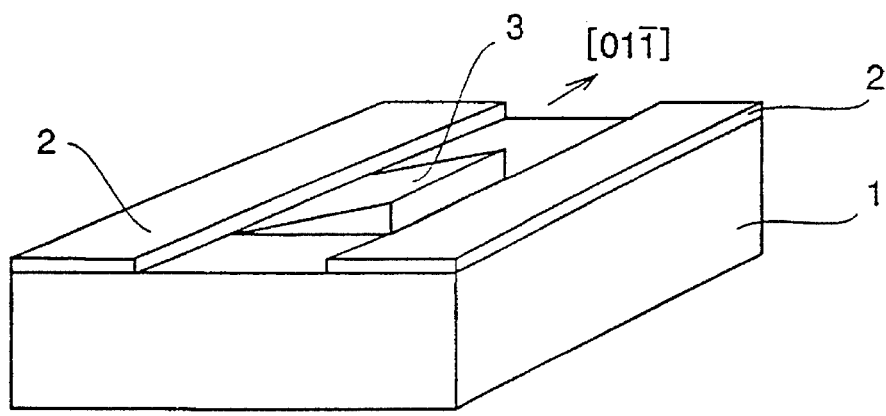
FIGS. 4(a)–4(b) are perspective views illustrating process steps of fabricating a window structure visible light semiconductor laser in accordance with a second embodiment of the present invention.
Figure 4:
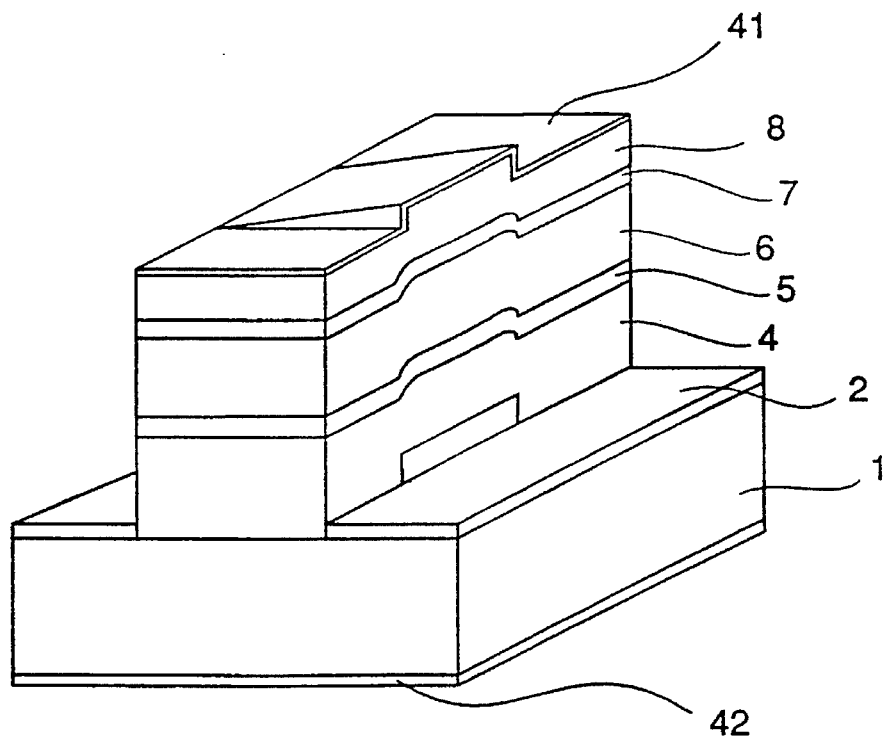

FIGS. 4(a) and 4(b) are perspective views illustrating process steps in a method of fabricating a visible light semiconductor laser according to the second embodiment of the present invention.

After the process steps already described with respect to FIGS. 1(a)–1(d), as illustrated in FIG. 4(a), the SiN film 2 on the GaAs substrate 1 is patterned to remove portions contacting the opposite sides of the n type GaAs layer 3 in the [01$\bar{1}$] direction, i.e., in what becomes the resonator length direction of the laser, whereby two stripe-shaped SiN films 2 extending in the [01$\bar{1}$] direction and opposed to each other with the n type GaAs layer 3 between them are produced.

Thereafter, using the stripe-shaped SiN films 2 as masks, an n type AlGaInP cladding layer 4, an undoped GaInP active layer 5, a p type AlGaInP cladding layer 6, a p type GaInP BDR layer 7, and a p type GaAs cap layer 8 are selectively grown on the substrate 1 having the n type GaAs layer 3 by MOCVD (FIG. 4(b)).

To complete the laser structure, a p side electrode 41 and an n side electrode 42 are formed on the p type cap layer 8 and on the rear surface of the substrate 1, respectively.

In this window-structure visible light semiconductor laser, since the selective growth of the semiconductor layers is carried out using the stripe-shaped SiN masks 2 sandwiching the n type GaAs layer 3 and extending in the [01$\bar{1}$] direction, i.e., the resonator length direction of the laser, a current confinement structure is produced with no current blocking layer. The operation of this semiconductor laser is identical to the operation of the semiconductor laser according to the first embodiment. The production process is significantly simplified as compared with the laser of the first embodiment.

Embodiment 3

Figure 5:
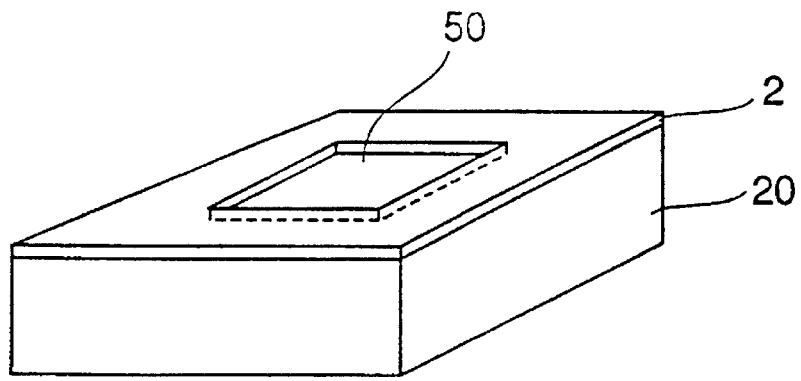
FIGS. 5(a)–5(c) are perspective views illustrating process steps of fabricating a window structure visible light semiconductor laser in accordance with a third embodiment of the present invention.
Figure 5:
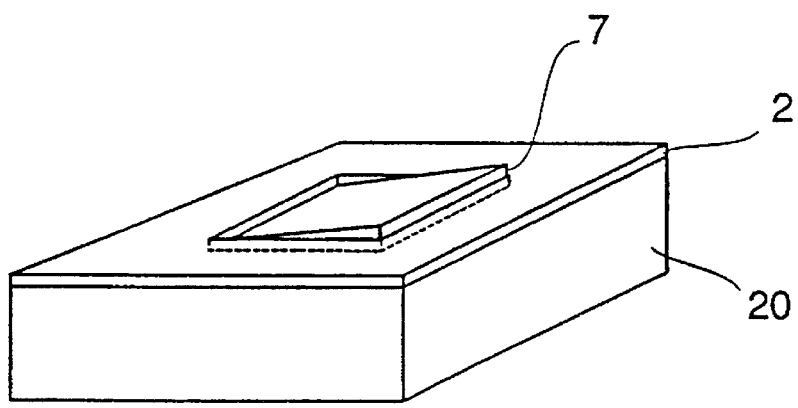
Figure 5:
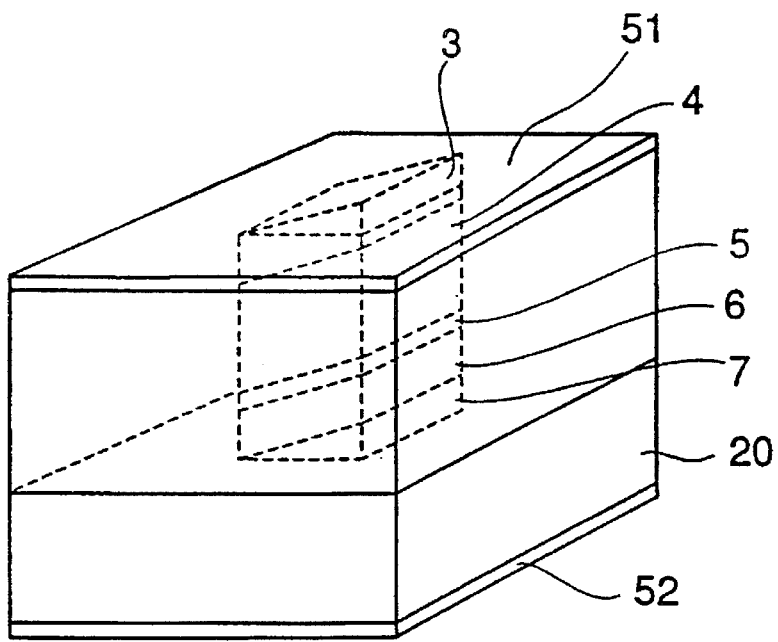

While in the above-described first and second embodiments of the invention an n type substrate is employed, in this third embodiment of the invention a window-structure visible light semiconductor laser employing a p type substrate is described. FIGS. 5(a) to 5(c) are perspective views illustrating process steps in a method of fabricating a visible light semiconductor laser according to the third embodiment of the invention.

Initially, an SiN film 2 having a rectangular opening 50 is formed on a 7° off (100) oriented p type GaAs substrate 20 (FIG. 5(a)).

Thereafter, a p type GaInP BDR layer 7 is selectively grown on a portion of the substrate 20 exposed in the opening 50 of the SiN film 2 (FIG. 5(b)). In the selective growth, the BDR layer 7 is grown in the form of a wedge because no atoms are supplied from the left side edge of the opening 50, whereby a just (100) oriented surface of the BDR layer 7 is produced.

After removal of the SiN film 2, a p type AlGaInP cladding layer 6, an undoped GaInP active layer 5, an n type AlGaInP cladding layer 4, and an n type GaAs contact layer 3 are successively grown on the substrate 20 with the BDR layer 7.

Thereafter, an n side electrode 51 and a p side electrode 52 are formed on the n type GaAs contact layer 3 and on the rear surface of the p type substrate 20, respectively, to complete the laser structure shown in FIG. 5(c).

In this window-structure visible light semiconductor laser according to the third embodiment of the invention, since the p type AlGaInP cladding layer 6 grown on the 7° off (100) surface of the substrate 1 where the BDR layer 7 is absent is disordered, when current is injected into the laser structure from the n side electrode 51 and the p side electrode 52, holes do not flow in the disordered p type AlGaInP cladding layer 6. That is, hole injection does not occur in the region where the p type GaInP BDR layer 7 is absent. On the other hand, current flows with high efficiency into the undoped GaInP active layer 5 grown on the just (100) surface of the p type GaInP BDR layer 7. Further, this laser structure is fabricated with high uniformity and reproducibility like the laser structure of the first embodiment of the invention.

Embodiment 4

While in the above-described first to third embodiments the n type GaAs layer 3 or the p type GaInP BDR layer 7 is grown directly on the GaAs substrate 1, in this fourth embodiment of the invention a groove 61 is formed at the surface of the GaAs substrate 1 and an n type GaAs layer 3 is grown in the groove 61.

Figure 6:
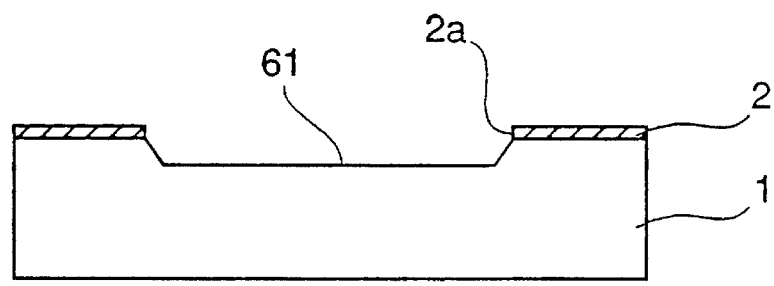
FIGS. 6(a)–6(b) are sectional views illustrating a substrate of a window structure visible light semiconductor laser in accordance with a fourth embodiment of the present invention.
Figure 6:
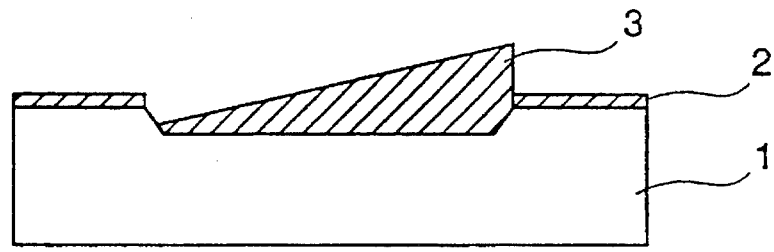

In production, initially, a center portion of the 7° off (100) oriented substrate 1 is selectively etched away with $H_2SO_4:H_2O_2:H_2O$ using an SiN film 2 having an opening 2a as a mask to form the groove 61 (FIG. 6(a)). Thereafter, as illustrated in FIG. 6(b), using the SiN film 2 as a mask, the n type GaAs layer 3 or a p type GaInP BDR layer (not shown in FIG. 6(b)) is selectively grown in the groove 61. After removal of the SiN film 2, the semiconductor layers as those shown in FIG. 2(a) are successively grown on the substrate 1 with the GaAs layer 3.

In this structure, the height of the wedge-shaped GaAs layer 3 from the surface of the substrate is reduced by the groove 61. Therefore, in addition to the effects of the present invention, since the active layer in the resonator region of the laser and the active layer in the window region are on approximately the same level, the discontinuity of the active layer at the boundary between the resonator region and the window region is reduced, resulting in a semiconductor laser with improved characteristics.

Embodiment 5

Figure 7:
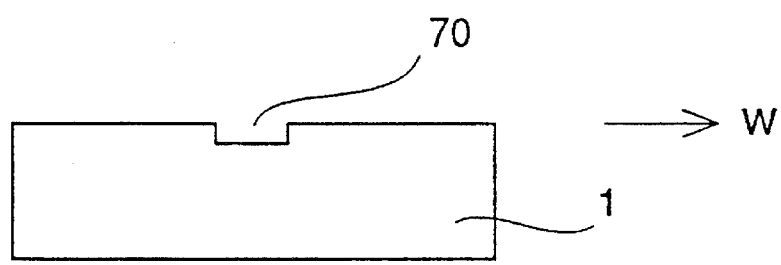
FIGS. 7(a)–7(b) are sectional views illustrating a substrate of a window structure visible light semiconductor laser in accordance with a fifth embodiment of the present invention.
Figure 7:
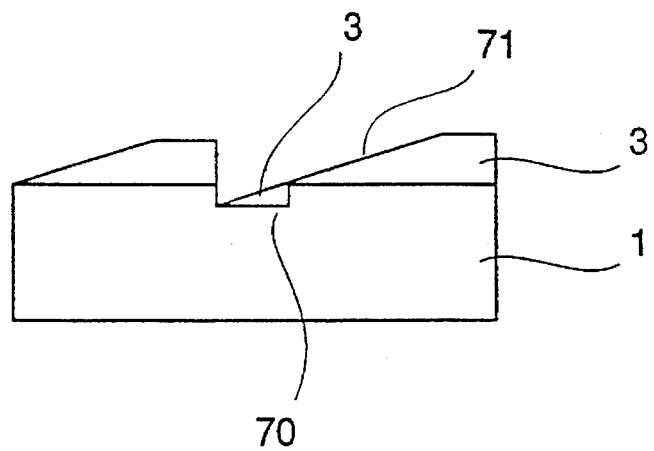

While in the above-described first to fourth embodiments the GaAs semiconductor layer 3 or the GaInP BDR layer 7 having a just (100) surface is formed in the opening of the SiN film 2, in this fifth embodiment of the invention a semiconductor layer having a just (100) surface is formed in a different method illustrated in FIGS. 7(a) and 7(b).

Initially, as illustrated in FIG. 7(a), a stripe-shaped groove 70 having a rectangular section and extending in what becomes the resonator length direction of the laser is formed at the surface of the 7° off (100) n type GaAs substrate 1. The width and the depth of the groove 70 are several microns. The length of the groove 70 in the resonator length direction is selected so that the groove 70 does not reach the facets of the laser. That is, the groove 70 is absent in the window regions of the laser structure. When an n type GaAs layer 3 is grown on the substrate 1 having the groove 70, the GaAs layer 3 grows forming a just (100) oriented surface 71 as shown in FIG. 7(b). After the formation of the GaAs layer 3 having the just (100) surface 71, an n type AlGaAs cladding layer 4, an undoped GaInP active layer 5, a p type AlGaInP layer 6, a p type GaInP BDR layer 7, and a p type GaAs cap layer 8 are successively grown on the entire surface of the substrate by MOCVD. A window-structure semiconductor laser is completed after formation of p side and n side electrodes.

In this fifth embodiment of the invention, since the step of removing the insulating film after the formation of the GaAs layer 3 is dispensed with, the production process is simplified.

The formation of the semiconductor layer 3 using the stripe-shaped groove 70 according to this fifth embodiment may be applied to a formation of a window-structure semiconductor laser employing a p type GaAs substrate.

While in the above-described first to fifth embodiments an active layer comprising $Ga_{0.5}In_{0.5}P$ is employed, an active layer comprising GaInP having a composition ratio of GaP:InP different from $Ga_{0.5}In_{0.5}P$, i.e., a strained active layer, may be employed.

Further, as illustrated in FIG. 9, the increase in the band gap energy of the grown layer due to an increase in the off-angle of the substrate from the (100) surface is obtained not only in GaInP but also in AlGaInP. Therefore, an active layer comprising AlGaInP may be employed.

What is claimed is:

1. A visible light semiconductor laser comprising:

a GaAs substrate having opposite first and second surfaces, said first surface making a first acute angle with a (100) surface toward the direction;

a semiconductor layer disposed on a part of the first surface of the GaAs substrate and making a second angle smaller than the first acute angle with the (100) surface, said semiconductor layer extending in the direction which becomes the resonator length direction of the laser, but not reaching opposed facets of the laser;

a first $Al_xGa_{1-x}InP$ (0≦x) active layer disposed on the surface making the second angle with the (100) surface of the semiconductor layer, said first active layer including regularly ordered atoms and having a first band gap energy; and a second $Al_xGa_{1-x}InP$ active layer disposed on the first surface of the GaAs substrate at opposite sides of the first active layer in the resonator length direction said second active layer including disordered atoms, having a second band gap energy larger than the first band gap energy of the first active layer, and serving as a window layer.

2. The visible light semiconductor laser of claim 1 wherein the first surface of the GaAs substrate makes an acute angle of 7° with the (100) surface toward the direction.

3. The visible light semiconductor laser of claim 1 wherein:
   said GaAs substrate has a rectangular groove in a prescribed region of the first surface where the $Al_xGa_{1-x}InP$ ($0 \leq x$) active layer in the ordered state is to be formed, the groove extending in the resonator length direction of the laser without reaching the resonator facets, and
   said semiconductor layer has the surface making the second angle smaller than the first acute angle with the (100) surface grown in the groove.

4. The visible light semiconductor laser of claim 3 wherein the surface making the second angle smaller than the first acute angle with the (100) surface of the semiconductor layer grown in the groove does not completely protrude from the first surface of the GaAs substrate.

5. The visible light semiconductor laser of claim 1 wherein:
   said GaAs substrate has a stripe-shaped rectangular groove in a prescribed region of the first surface where the $Al_xGa_{1-x}InP$ ($0 \leq x$) active layer in the ordered state is to be formed, said groove extending in the resonator length direction of the laser without reaching the resonator facets, and
   said semiconductor layer is grown on the entire surface of the GaAs substrate so that at least a portion of the semiconductor layer grown in the groove has a surface making the second angle with the (100) surface.

* * * * *